US012187548B2

United States Patent
Shiroishi et al.

(10) Patent No.: US 12,187,548 B2
(45) Date of Patent: Jan. 7, 2025

(54) ARTICLE TRANSPORT FACILITY

(71) Applicant: Daifuku Co., Ltd., Osaka (JP)

(72) Inventors: Keisuke Shiroishi, Hinocho (JP); Naoya Toyoshima, Hinocho (JP); Kenji Tamura, Hinocho (JP)

(73) Assignee: Daifuku Co., Ltd., Osaka (JP)

( * ) Notice: Subject to any disclaimer, the term of this patent is extended or adjusted under 35 U.S.C. 154(b) by 110 days.

(21) Appl. No.: 18/199,405

(22) Filed: May 19, 2023

(65) Prior Publication Data

US 2023/0373733 A1 Nov. 23, 2023

(30) Foreign Application Priority Data

May 20, 2022 (JP) ................................. 2022-082917

(51) Int. Cl.
*B65G 47/46* (2006.01)
(52) U.S. Cl.
CPC ................................... *B65G 47/46* (2013.01)
(58) Field of Classification Search
None
See application file for complete search history.

(56) References Cited

U.S. PATENT DOCUMENTS

| | | | | |
|---|---|---|---|---|
| 1,934,377 A | * | 11/1933 | Robbins | B65G 47/487 198/463.3 |
| 8,459,442 B2 | * | 6/2013 | Morimoto | H01L 21/67736 198/346.3 |
| 10,604,351 B2 | * | 3/2020 | Takahara | H01L 21/6773 |
| 2004/0109746 A1 | * | 6/2004 | Suzuki | H01L 21/67733 414/373 |
| 2018/0122671 A1 | * | 5/2018 | Niiyama | B65G 43/10 |
| 2019/0248589 A1 | * | 8/2019 | Iwata | B65G 9/008 |
| 2021/0155406 A1 | * | 5/2021 | Ito | H01L 21/67733 |
| 2024/0124245 A1 | * | 4/2024 | Sato | B07C 5/36 |
| 2024/0253906 A1 | * | 8/2024 | Tobayama | B65G 47/61 |

FOREIGN PATENT DOCUMENTS

| | | | | | |
|---|---|---|---|---|---|
| CN | 117088054 A | * | 11/2023 | | B65G 35/00 |
| JP | 1129205 A | | 2/1999 | | |
| JP | 4127138 B2 | * | 7/2008 | | |
| JP | 4337683 B2 | * | 9/2009 | | B65G 37/02 |
| JP | 2023170850 A | * | 12/2023 | | B65G 35/00 |
| JP | 7556376 B2 | * | 9/2024 | | B65G 35/00 |
| KR | 101713578 B1 | * | 1/2000 | | |
| KR | 102586754 B1 | * | 1/2000 | | |
| KR | 20230162536 A | * | 1/2000 | | |
| TW | 202408909 A | * | 3/2024 | | B65G 35/00 |

* cited by examiner

*Primary Examiner* — Joseph A Dillon, Jr.
(74) *Attorney, Agent, or Firm* — The Webb Law Firm (57) ABSTRACT

An article transport facility includes a plurality of article transport vehicles. A travel route includes a main transport route; a first branch route that branches from the main transport route, passes through a transfer position at which an article is transferred, and merges with the main transport route; and a second branch route that branches from the first branch route at a position downstream of the transfer position, or branches from the main transport route, and merges with the first branch route at a position upstream of the transfer position. The first branch route includes a first standby section at a position upstream of the transfer position, and the second branch route includes a second standby section.

7 Claims, 8 Drawing Sheets

ARTICLE TRANSPORT FACILITY

CROSS REFERENCE TO RELATED APPLICATION

This application claims priority Japanese Patent Application No. 2022-082917, filed May 20, 2022, the disclosure of which is hereby incorporated by reference in its entirety.

BACKGROUND OF THE INVENTION

1. Field of the Invention

The present invention relates to an article transport facility including a plurality of article transport vehicles that travel along a predetermined travel route and transport articles.

2. Description of the Related Art

An example of an article transport facility such as that described above is disclosed in JP H11-029205A (Patent Document 1). The reference numerals shown in parentheses in the following description of the related art are the reference numerals used in Patent Document 1.

The article transport facility (autonomous-travel transport facility) in Patent Document 1 includes a main route (6a) and a sub route (6b) on which a plurality of article transport vehicles (AGV5) travel. The main route (6a) is a loop-like travel route that connects a storage rack (stocker 2) to a plurality of processing devices (10). The sub route (6b) is a travel route that branches off from the main route (6a) on the downstream side of the storage rack and then merges with the main route (6a) on the upstream side. Each article transport vehicle travels along the main route (6a), receives an article (cassette 1) from a processing device (10), delivers the article to the storage rack, and then moves to the sub route (6b). Accordingly, an article can be transported using the sub route (6b) while avoiding competition with a trailing article transport vehicle that is to receive an article from the storage rack and transport the article to a processing device, thus improving the overall transport efficiency of the article transport facility.

In the article transport facility in Patent Document 1, the article transport vehicles each stop at a stocker-facing stop position (8a) on the main route (6a), and move an article to or from a port (inlet port 7a or outlet port 7b) of the storage rack. For this reason, while one article transport vehicle is moving an article to or from a port, another article transport vehicle traveling on the main route (6a) needs to stop and wait at a main route standby position (9a). In this way, in the above-described article transport facility, the traveling of the other article transport vehicle is hindered on the main route (6a), and thus there is room for improvement in terms of improving the article transport efficiency. Also, with such an article transport facility, article transport vehicle congestion is likely to occur on the main route (6a), thus making it difficult to increase the number of article transport vehicles in order to improve the article transport efficiency.

SUMMARY OF THE INVENTION

In view of this, there is desire for the realization of an article transport facility that can avoid the case where the passage of an article transport vehicle on the main transport route is hindered by an article transport vehicle waiting in front of a port, and enables articles to be efficiently transported by the article transport vehicles.

An article transport facility according to an aspect of the present disclosure is an article transport facility including a plurality of article transport vehicles each configured to travel along a predetermined travel route and transport an article, the travel route including:
a main transport route connecting a plurality of processing devices to each other;
a first branch route branching from the main transport route, passing through a transfer position at which an article is transferred to a port of a first processing device among the plurality of processing devices, and merging with the main transport route; and
a second branch route branching from the first branch route at a position downstream of the transfer position, or branching from the main transport route, and merging with the first branch route at a position upstream of the transfer position, the first branch route including, at a position upstream of the transfer position, a first standby section enabling a loaded transport vehicle, which is an article transport vehicle holding an article among the plurality of article transport vehicles, to wait therein, and the second branch route including a second standby section enabling an empty transport vehicle, which is an article transport vehicle not holding an article among the plurality of article transport vehicles, to wait therein.

According to this configuration, both the loaded transport vehicle and the empty transport vehicle can be caused to wait in a standby state on the upstream side of the transfer position without hindering the traveling of other article transport vehicles on the main transport route. Accordingly, when a processed article has appeared at the port of a processing device, the empty transport vehicle can be quickly dispatched to the port. Also, after the article has been unloaded from the port of the processing device, the loaded transport vehicle can be quickly dispatched to the port and supply a new article to the port. Accordingly, articles can be efficiently delivered to and unloaded from the processing device.

Here, in the case where the second branch route branches off from the first branch route, the empty transport vehicle that has transferred an article to the port can quickly travel to the second standby section without hindering the traveling of article transport vehicles on the main transport route.

Also, in the case where the second branch route branches off from the main transport route, even if a loaded transport vehicle is stopped at the transfer position, for example, an empty transport vehicle traveling on the main transport route can quickly move to the second standby section.

In this way, according to the present disclosure, it is possible to avoid the case where the passage of an article transport vehicle on the main transport route is hindered by an article transport vehicle waiting in front of a port, and articles can be efficiently transported to processing devices.

Further features and advantages of the article transport facility will become apparent from the following description of exemplary and non-limiting embodiments, which are described with reference to the drawings.

DESCRIPTION OF THE INVENTION

Embodiments of an article transport facility will be described below with reference to the drawings.

First Embodiment

Figure 1:
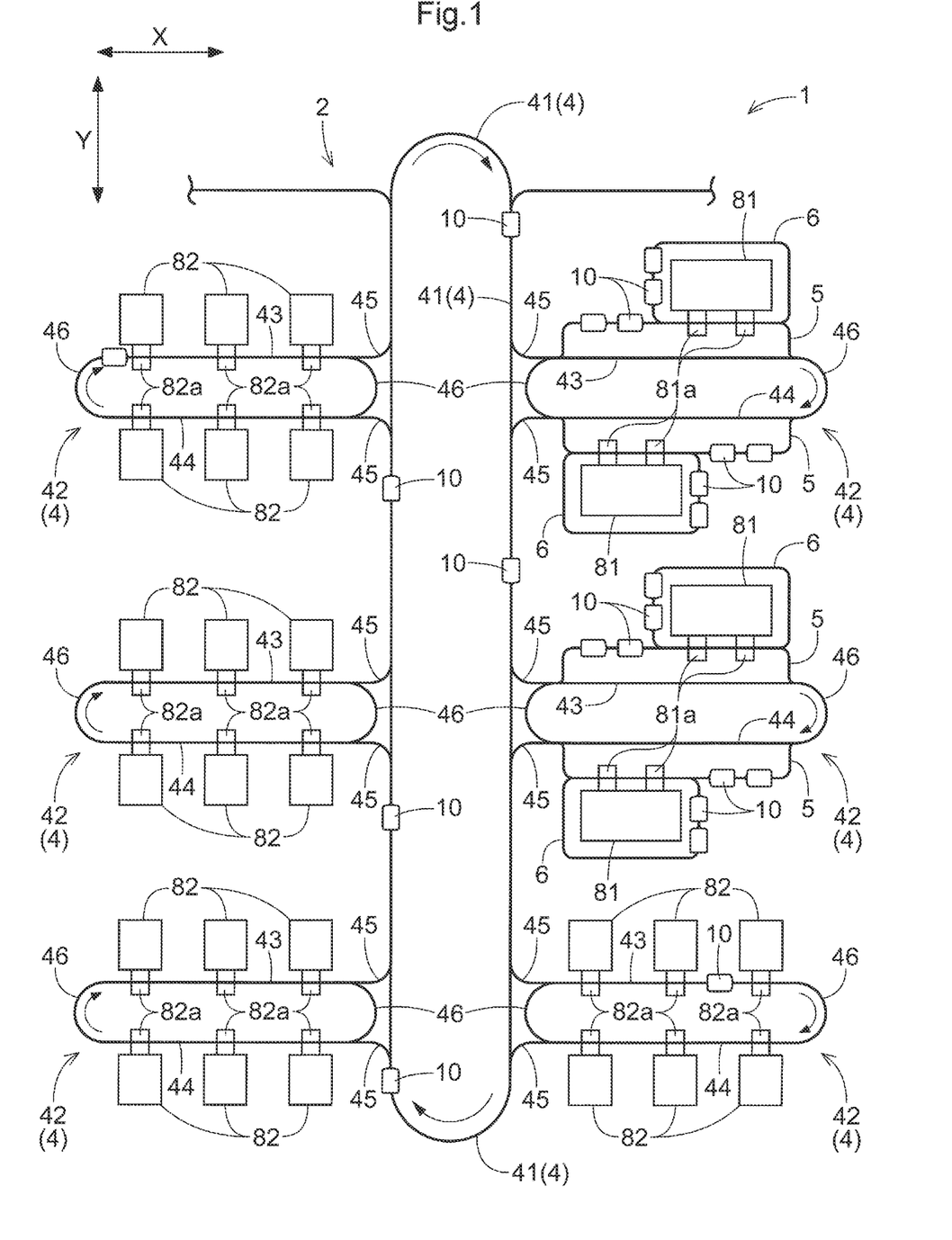
FIG. 1 is a plan view of an article transport facility.
Figure 2:
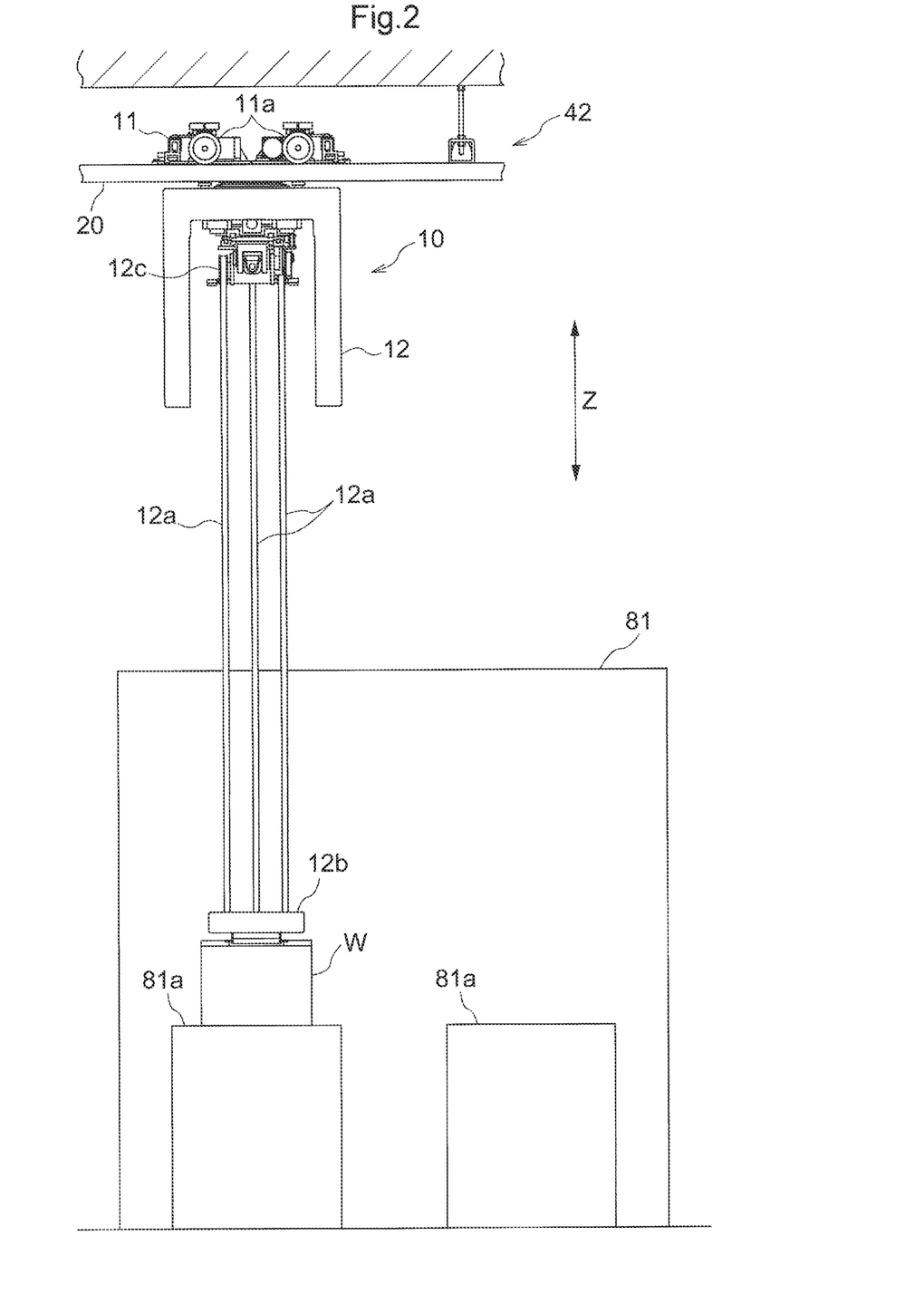
FIG. 2 is a side view of an article transport vehicle.

As shown in FIGS. 1 and 2, an article transport facility 1 includes a plurality of article transport vehicles 10 that travel along a predetermined travel route 2 and transport articles W. In the present embodiment, rails 20 are provided along the travel route 2, and the article transport vehicles 10 are guided by the rails 20 while traveling along the travel route 2. In other words, the travel route 2 of the article transport vehicles 10 is formed by the rails 20. In the present embodiment, the rails are provided above the floor surface. Specifically, as shown in FIG. 2, the rails 20 are fixed to and suspended from the ceiling. In other words, in the present embodiment, the article transport vehicles 10 are overhead transport vehicles that travel along the rails 20 provided on the ceiling. Note that in this example, a pair of rails 20 are provided along the travel route 2. The article transport vehicles 10 are guided by the pair of rails 20 while traveling along the travel route 2. The article transport vehicles 10 are controlled so as to travel in the same direction as each other (the direction indicated by the arrow in FIG. 1) in all sections of the travel route 2. In other words, in this example, the travel route 2 is a one-way route. Note that the travel route 2 is not required to be formed physically with the rails 20 or the like, and may also be set virtually. Also, the article transport vehicles 10 may be transport vehicles other than overhead transport vehicles.

As shown in FIGS. 1 and 2, the article transport facility 1 includes first processing devices 81 and second processing devices 82. The first processing devices 81 and the second processing devices 82 are arranged along the travel route 2. The first processing devices 81 and the second processing devices 82 are devices for processing articles W. In the present embodiment, the articles W are each a container that accommodates a substrate such as a semiconductor wafer (an example of a stored object), and the first processing devices 81 and the second processing devices 82 perform processing (e.g., cleaning processing or etching processing) on the stored objects accommodated in the articles W. In this example, a plurality of first processing devices 81 and a plurality of second processing devices 82 are arranged along the travel route 2. The article transport vehicles 10 travel along the travel route 2 and move articles W to and from the first processing devices 81 and the second processing devices 82. In the illustrated example, the first processing devices 81 are larger than the second processing devices 82 in plan view.

In the present embodiment, as shown in FIGS. 1 and 2, each of the first processing devices 81 includes N (N being an integer greater than or equal to 2) first ports 81a. In other words, each of the first processing devices 81 includes a plurality of first ports 81a. In this example, each first processing device 81 has the same number (N) of first ports 81a. Also, in this example, each of the second processing devices 82 has a single second port 82a. The article transport vehicles 10 move articles W to and from the first ports 81a and the second ports 82a. An article W to be processed by a first processing device 81 is delivered to and unloaded from the first port 81a, and an article W to be processed by the second processing device 82 is delivered to and unloaded from the second port 82a. In the illustrated example, each of the first processing devices 81 has two first ports 81a. Note that the first processing devices 81 correspond to a "processing device", and the first ports 81a correspond to a "port".

As described above, in the present embodiment, the article transport vehicles are overhead transport vehicles that travel along the rails 20 provided on the ceiling. Specifically, as shown in FIG. 2, each of the article transport vehicles 10 includes a traveling section 11 that has wheels 11a that roll on the rails 20 and travels along the rails 20, and a body section 12 that is supported by and suspended from the traveling section 11 and is positioned below the rails 20. The body section 12 includes an elevating body 12b capable of supporting an article W, and an elevating mechanism 12c for raising and lowering the elevating body 12b. The elevating mechanism 12c includes cord-like bodies 12a that support the elevating body 12b in a suspended manner and are wound around winding bodies, and has a configuration in which the winding bodies are rotated in a forward direction or a reverse direction to wind up or feed out the cord-like bodies 12a, thus raising or lowering the elevating body 12b relative to the traveling section 11. Specifically, the elevating mechanism 12c raises and lowers the elevating body 12b between two heights, namely a first height employed when the article transport vehicle 10 is traveling (in the present embodiment, a height at which the elevating body 12b is positioned inside the cover of the body section 12), and a second height that is lower than the first height and is employed when an article W is moved between the elevating body 12b and the transfer target location of the article W (the first port 81a or the second port 82a).

Note that in the present embodiment, a first direction X is a direction parallel with a first main line portion 5b (FIG. 3) of a later-described first branch route 5, and a second direction Y is a direction orthogonal to the first direction X in a view along an up-down direction Z. Also, in the following description, a loaded transport vehicle 10a is an article transport vehicle 10 that is holding an article W, and an empty transport vehicle 10b is an article transport vehicle 10 that is not holding an article W.

In the present embodiment, the travel route 2 includes a main transport route 4, first branch routes 5, and second branch routes 6. The configurations of the main transport route 4, the first branch routes 5, and the second branch routes 6 will be described in more detail below.

As shown in FIG. 1, the main transport route 4 is arranged to connect the first processing devices 81 to each other. In the present embodiment, the main transport route 4 is arranged to connect the first processing devices 81 to each other via the first branch routes 5. Also, the main transport route 4 is arranged to connect the second processing devices 82 to each other, in addition to connecting the first processing devices 81 to each other. More specifically, the main transport route 4 connects the first processing devices 81 to each other by connecting together routes that include positions corresponding to the first ports 81a of the first processing devices 81 (i.e., the first branch routes 5 that include first transfer positions 23). Also, the main transport route 4 connects the second processing devices 82 to each other by connecting a position corresponding to the second port 82a of one second processing device 82 (i.e., one second transfer position 24) to a position corresponding to the second port 82a of a different second processing devices 82 (i.e., a different second transfer position 24).

In the present embodiment, as shown in FIG. 1, the main transport route 4 includes one loop-shaped first route 41, a plurality of loop-shaped second routes 42, and a plurality of connection routes 45 that connect the first route 41 to the second routes 42. The second routes 42 are arranged so as to connect processing devices (first processing devices 81 or second processing devices 82) to each other. In this example, some of the second routes 42 connect first processing devices 81 to each other via first branch routes 5, and the other second routes 42 connect second processing devices 82 to each other.

Also, in this example, the second routes 42 are arranged in two groups on opposite sides of the first route 41 in the first direction X. The second routes 42 in each group are adjacent to each other in the second direction Y. In the illustrated example, two first processing devices 81 are connected to each of two of the plurality of (here, three) second routes 42 arranged on one side of the first route 41 in the first direction X. For each of those two second routes 42, one first branch route 5 is arranged between the second route 42 and each of the first processing devices 81, and the first processing devices 81 are connected to the second route 42 via the corresponding first branch routes 5. A plurality of (here, six) second processing devices 82 are connected to the remaining second route 42 on the one side.

As shown in FIG. 1, each of the second routes 42 includes a first section 43 extending in the first direction X, a second section 44 parallel with the first section 43, and connecting sections 46 that connect the ends of the first section 43 and the second section 44 to each other. The second route 42 is thus loop-shaped. The first section 43 and the second section 44 each have an end that faces the first route 41, and each of those ends is connected to the first route 41 by a connection route 45. The first processing devices 81 and the second processing devices 82 are arranged along the first section 43 or the second section 44. In the illustrated example, the first section 43 and the second section 44 are straight sections.

In this example, the second transfer positions 24 are set in the first section 43 and the second section 44. Also, in this example, the second transfer positions 24 are overlapped with the second ports 82a of the second processing devices 82 when viewed in the up-down direction Z. In the illustrated example, each of the second processing devices 82 has a single second port 82a. A plurality (here, three) of the second processing devices 82 are arranged side by side in each of the first section 43 and the second section 44. Accordingly, a plurality (here, three) of the second transfer positions 24 are set in each of the first section 43 and the second section 44. The article transport vehicles 10 stop at the second transfer positions 24 and move articles W to and from the second ports 82a.

In the present embodiment, the article transport vehicles 10 all travel in the same circumferential direction on the first route 41 and the second routes 42. In FIG. 1, the travel direction of the article transport vehicles 10 is indicated by arrows.

Figure 3:
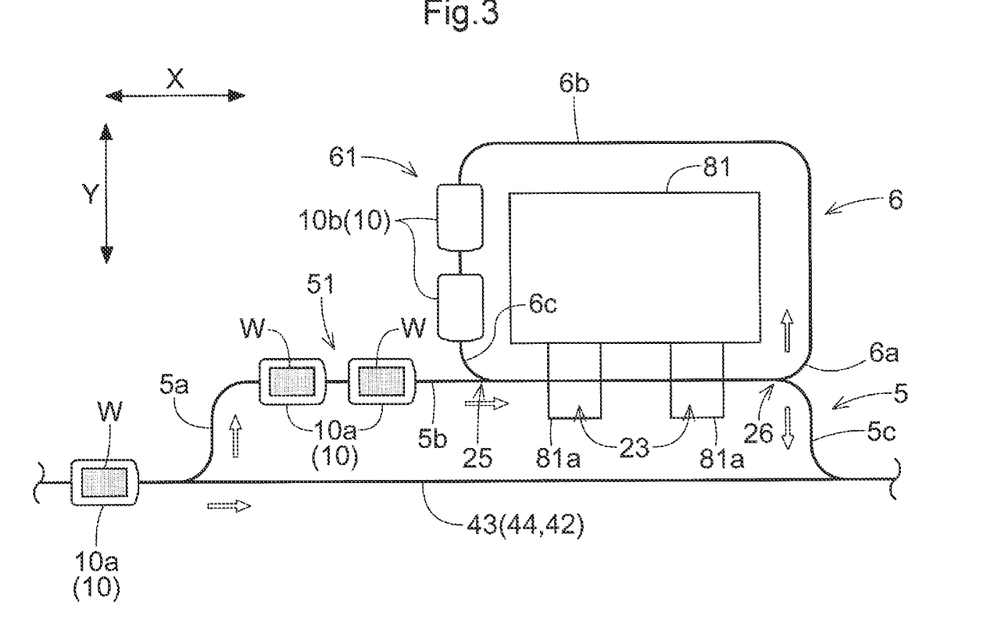
FIG. 3 is a plan view schematically showing the arrangement of a first branch route, a second branch route, and a first processing device.

As shown in FIGS. 1 and 3, each of the first branch routes 5 branches off from the main transport route 4, passes through a plurality of first transfer positions 23, which are positions for transferring articles W to the first ports 81a of the corresponding processing devices, and then merges with the main transport route 4. In the present embodiment, the first branch route 5 branches off from the second route 42, passes through the first transfer positions 23, and then merges with the second route 42. In this example, some of the first branch routes 5 branch off from the first section 43 of the corresponding second route 42, pass through the first transfer positions 23, and then merge with the same first section 43. The other first branch routes 5 branch off from the second section 44 of the corresponding second route 42, pass through the corresponding first transfer positions 23, and then merge with the same second section 44. Note that the first transfer positions 23 correspond to the "transfer position".

In the present embodiment, as shown in FIGS. 3 to 6, each of the first branch routes 5 includes a first branch connection portion 5a, a first main line portion 5b, and a first merge connection portion 5c. The first branch connection portion 5a is a section that branches off from the first section 43 or the second section 44 of the second route 42, and is a section in which the article transport vehicle 10 traveling on the second route 42 moves to the first branch route 5. The first main line portion 5b is a section in which the article transport vehicle 10 can travel straight along the first direction X, and is a section that connects the first branch connection portion 5a to the first merge connection portion 5c. The first merge connection portion 5c is a section in which the article transport vehicle 10 merges (moves) from the first branch route 5 to the first section 43 or the second section 44 of the second route 42. In the example shown in FIG. 1, such first branch routes 5 are provided on both sides of the second route 42 in the second direction Y.

In the present embodiment, the first transfer positions 23 are set in the first branch route 5. Specifically, the first transfer positions 23 are set in the first main line portion 5b. As shown in FIG. 3, in this example, the first transfer positions 23 are overlapped with the first ports 81a of the first processing devices 81 when viewed in the up-down direction Z. The article transport vehicles 10 stop at the first transfer positions 23 in the first main line portion 5b, and move articles W to and from the first ports 81a. Also, in the present embodiment, the first branch route 5 is formed so as to pass through N (N being an integer greater than or equal to 2) first transfer positions 23. Specifically, each of the first processing devices 81 includes N first ports 81a as described above. Therefore, the same number of first transfer positions 23 as the corresponding first ports 81a are set in one first main line portion 5b. These first transfer positions 23 are arranged side by side in the first direction X. In the example shown in FIGS. 3 to 6, the first processing device 81 includes two first ports 81a, and therefore two first transfer positions 23 are set in the first main line portion 5b in correspondence with the two first ports 81a.

As shown in FIGS. 3 to 6, a first standby section 51 for allowing a loaded transport vehicle 10a to wait in a standby state is set upstream of the first transfer positions 23 in the first branch route 5. In the present embodiment, the first standby section 51 is set upstream of the first transfer positions 23 in the first main line portion 5b. More specifically, the first standby section 51 is set upstream of the most upstream first transfer position 23 among the first transfer positions 23. Here, the first standby section 51 is a section set for the stopping and waiting of a loaded transport vehicle 10a among article transport vehicles 10 that are bound for the first transfer positions 23. As described above, the loaded transport vehicle 10a is an article transport vehicle 10 that is holding an article W. The loaded transport vehicle 10a stops and waits in the first standby section 51 in order to avoid collision with an article transport vehicle 10 (loaded transport vehicle 10a or empty transport vehicle 10b) that is stopped ahead at a first transfer position 23.

As shown in FIGS. 1 and 3, a second branch route 6 branches off from a first branch route 5 at a position downstream of the first transfer positions 23, or branches off from the main transport route 4, and then merges with the first branch route 5 at a position upstream of the first transfer positions 23. In the present embodiment, the second branch route 6 branches off from the first branch route 5 at a position downstream of the first transfer positions 23, and merges with the first branch route 5 at a position upstream of the first transfer positions 23. More specifically, the second branch route 6 branches off from the first main line portion 5b at a position downstream of the first transfer positions 23 (more specifically, the first transfer position 23 located most downstream), and merges with the first main line portion 5b at a position upstream of the first transfer positions 23 (more specifically, the first transfer position 23 located most upstream) in the first main line portion 5b. In the present embodiment, a merge portion 25 between the first branch route 5 and the second branch route 6 is arranged adjacent to the first transfer positions 23 on the upstream side thereof. In this example, the merge portion 25 is arranged adjacent to the upstream side of the first transfer position 23 located most upstream among the first transfer positions 23. Also, in the present embodiment, a branch portion 26 between the first branch route 5 and the second branch route 6 is arranged adjacent to the first transfer positions 23 on the downstream side thereof. In the present example, the branch portion 26 is arranged adjacent to the downstream side of the first transfer position 23 located most downstream among the first transfer positions 23.

As shown in FIGS. 3 to 6, the second branch route 6 includes a second branch connection portion 6a, a second main line portion 6b, and a second merge connection portion 6c. The second branch connection portion 6a is a section that branches off from the downstream side of the first transfer positions 23 in the first main line portion 5b of the first branch route 5, and is a section in which an article transport vehicle 10 that has delivered an article W to a first port 81a (i.e., an empty transport vehicle 10b) moves (diverges) to the second branch route 6. In this example, the connecting portion between the second branch connection portion 6a and the first main line portion 5b is the branch portion 26 between the first branch route 5 and the second branch route 6. The second main line portion 6b is a section that connects the second branch connection portion 6a to the second merge connection portion 6c. In the illustrated example, the second main line portion 6b is arranged so as to surround the first processing device 81, but if it is possible to avoid interference between the first processing devices 81 and an article transport vehicle 10 traveling on the second branch route 6, the second branch route 6 may be formed so as to have a portion that is overlapped with the first processing devices 81 when viewed in the up-down direction Z. The second merge connection portion 6c is a section in which the article transport vehicle 10 (empty transport vehicle 10b) merges (moves) from the second branch route 6 to the first main line portion 5b of the first branch route 5. In this example, the connection portion between the second merge connection portion 6c and the first main line portion 5b is the merge portion 25 between the first branch route 5 and the second branch route 6. The connecting portion (merge portion 25) between the second merge connection portion 6c and the first main line portion 5b is formed at a position that is between the above-described first standby section 51 and the first transfer positions 23, and furthermore between a later-described second standby section 61 and the first transfer positions 23. In this example, a plurality (here, two) of the first transfer positions 23 are arranged between the merge portion 25 and the branch portion 26. Similarly, the first ports 81a are arranged between the merge portion 25 and the branch portion 26. In the example shown in FIG. 1, the first branch routes 5 and the second branch routes 6 are provided on both sides of the second route 42 in the second direction Y.

As shown in FIGS. 3 to 6, the second branch route 6 includes a second standby section 61 for allowing an empty transport vehicle 10b to wait in a standby state. In the present embodiment, the second standby section 61 is set in the second main line portion 6b. In this example, the second standby section 61 is set at a position near the merge portion 25 between the second branch route 6 and the first branch route 5, in the second main line portion 6b. Here, the second standby section 61 is a section set for the stopping and waiting of an empty transport vehicle 10b among article transport vehicles 10 that are bound for the first transfer positions 23. An article transport vehicle 10 that has delivered an article W to a first port 81a at a first transfer position 23 (i.e., an empty transport vehicle 10b) moves from the first main line portion 5b of the first branch route 5 to the second branch route 6, and stops and waits in the second standby section 61. Accordingly, the empty transport vehicle 10b waiting in the second standby section 61 can quickly move to a first transfer position 23 and receive an article W from a first port 81a.

As shown in FIGS. 3 to 6, in the present embodiment, the first standby section 51 and the second standby section 61 each have a length that allows a plurality of article transport vehicles 10 to wait therein. Specifically, the first standby section 51 has a length that allows N loaded transport vehicles 10a to wait therein, and the second standby section 61 allows N empty transport vehicles 10b to wait therein. In other words, the upper limit of the number of loaded transport vehicles 10a that can wait in the first standby section 51 is N or more, and the upper limit of the number of empty transport vehicles 10b that can wait in the second standby section 61 is N or more. In this way, in the present embodiment, in each of the first standby section 51 and the second standby section 61, the number of article transport vehicles 10 that can wait therein is the same as the number (N) of first ports 81a of the corresponding first processing device 81. In this example, the first standby section 51 and the second standby section 61 each have a length according to which the same number of article transport vehicles 10 as the number of first ports 81a (i.e., the number of set first transfer positions 23) can wait therein in a single line. In the examples shown in FIGS. 3 to 6, one first processing device 81 includes two first ports 81a, and two first transfer positions 23 are set in correspondence therewith. Also, the first standby section 51 and the second standby section 61 each have a length that allows two article transport vehicles 10 to stop in a single line.

In FIG. 3, a plurality of loaded transport vehicles 10a have been stopped in the first standby section 51. Similarly, a plurality of empty transport vehicles 10b have been stopped in the second standby section 61. Accordingly, a loaded transport vehicle 10a or an empty transport vehicle 10b can be quickly dispatched to the first transfer position 23. Then, after delivering an article W to the first port 81a at the first transfer position 23, the article transport vehicle 10 (empty transport vehicle 10b) moves from the first branch route 5 to the second standby section 61 of the second branch route 6, thus allowing empty transport vehicles 10b to be continuously dispatched to the second standby section 61. Also, a loaded transport vehicle 10a that has collected an article W processed by a first processing device 81 from the corresponding first port 81a can quickly move from the first branch route 5 to the main transport route 4 (here, the second route 42). Accordingly, the number of processing targets processed by the first processing device 81 per unit time increases, thus making it possible to improve the operating efficiency of the first processing devices 81 (processing efficiency for processing targets).

Note that in this example, as shown in FIG. 1, the first branch routes 5 and the second branch routes 6 are provided in some of the second routes 42. Specifically, a plurality of first processing devices 81 are provided in some of the second routes 42. The first branch routes 5 and the second branch routes 6 are provided in correspondence with first processing devices 81. However, the first processing devices 81 may be provided in all of the second routes 42, and correspondingly, the first branch routes 5 and the second branch routes 6 may be provided in all of the second routes 42.

Also, in this example, the first processing devices 81 and the second processing devices 82 are provided on different second routes 42, but a first processing device 81 and a second processing device 82 may be provided in the same second route 42.

Figure 8:
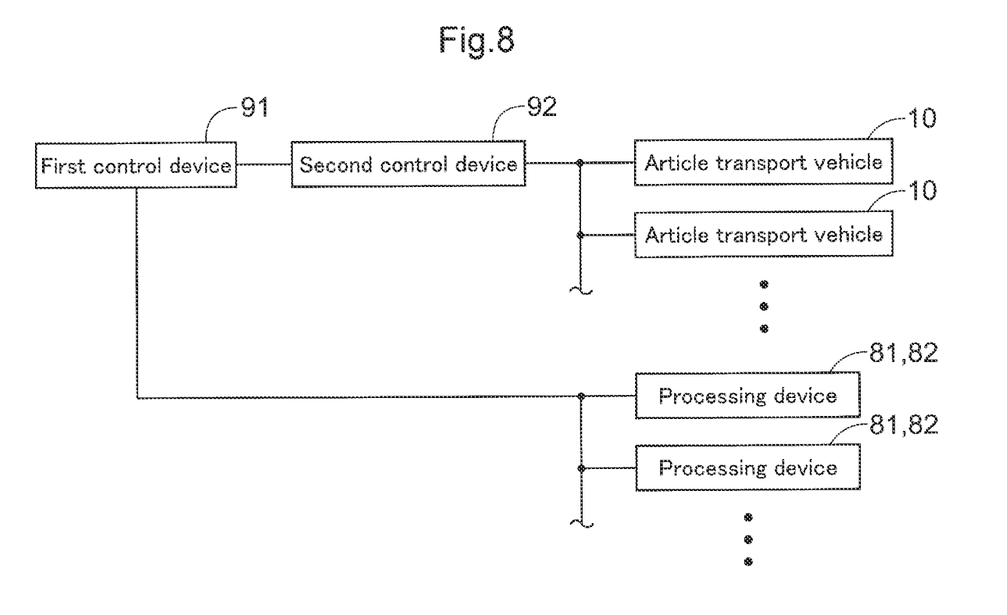
FIG. 8 is a control block diagram.

As shown in FIG. 8, the article transport facility 1 according to the present embodiment includes a first control device 91 that controls the transport of articles W in the whole facility and the operation of the processing devices (first processing devices 81 and second processing devices 82). The article transport facility 1 also includes a second control device 92 that controls the article transport vehicles 10. In this example, the second control device 92 controls the article transport vehicles 10 in accordance with commands from the first control device 91. Each of these control devices includes a processor such as a microcomputer and peripheral circuits such as a memory, and the functions of the control devices are realized by such hardware operating in cooperation with a program executed on the hardware (e.g., the processor). The first control device 91 is communicably connected to the second control device 92. Note that the second control device 92 corresponds to a "control device".

In the present embodiment, the second control device 92 executes first transport control and second transport control. The first transport control is control for delivering an article W to a first port 81a of a first processing device 81. The second transport control is control for delivering an article W to a second port 82a of a second processing device 82. First, the second transport control will be described below.

When a command to transport an article W to a second processing device 82 is received from the first control device 91, the second control device 92 selects the loaded transport vehicle 10a that will arrive at that second processing device 82 in the shortest time from among the loaded transport vehicles 10a located on the main transport route 4, for example. The second control device 92 then controls the loaded transport vehicle 10a so as to transport the article W to the second port 82a of the second processing device 82 that corresponds to the transport destination. The loaded transport vehicle 10a travels along the shortest route from the current position and stops at the second transfer position 24 corresponding to the second port 82a that is the transport destination. The loaded transport vehicle 10a then delivers the article W to the second port 82a. That article transport vehicle 10, which delivered the article W and thus changed from being a loaded transport vehicle 10a to being an empty transport vehicle 10b, stops and waits at the second transfer position 24 until the next transport command is received from the second control device 92, for example.

When a command to receive an article W from a second processing device 82 is received from the first control device 91, the second control device 92 selects the empty transport vehicle 10b that will arrive at that second processing device 82 in the shortest time, for example. The second control device 92 then controls the empty transport vehicle 10b to move to the second transfer position 24 that corresponds to the second port 82a of the second processing device 82. The empty transport vehicle 10b travels along the shortest route from the current position on the main transport route 4 to the second transfer position 24 corresponding to the second port 82a where the article W is to be received, and receives the article W from the second port 82a. That article transport vehicle 10, which received the article W and thus changed from being an empty transport vehicle 10b to being a loaded transport vehicle 10a, stops and waits at the second transfer position 24 until the next transport command is received from the second control device 92, for example.

Figure 7:
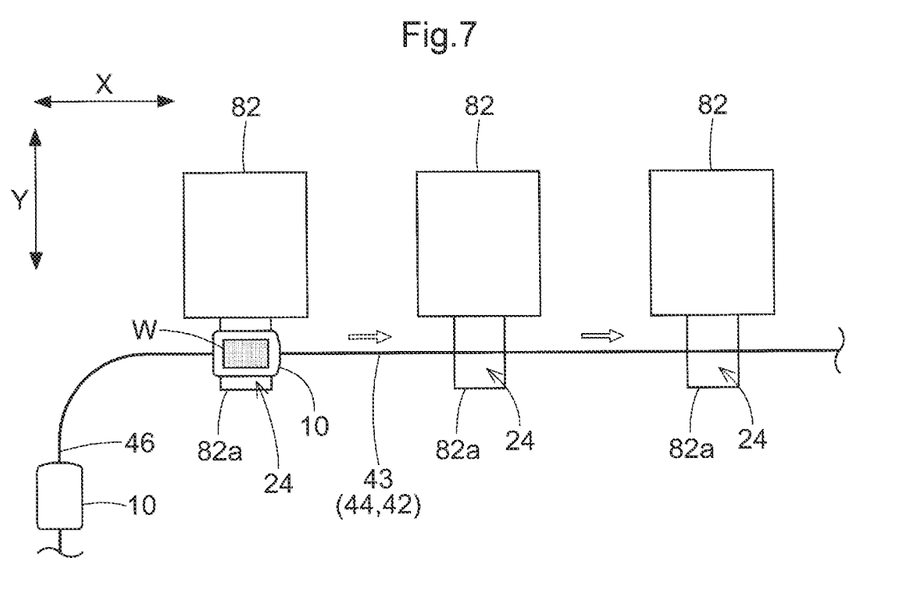
FIG. 7 is a plan view schematically showing travel routes of an empty transport vehicle and a loaded transport vehicle.

Also, as shown in FIG. 7, in the case where an article transport vehicle 10 is stopped ahead at a second transfer position 24 that is the destination, and a trailing article transport vehicle 10 cannot reach that second transfer position 24, the second control device 92 causes the trailing article transport vehicle 10 to stop (wait) at a position in front of the second transfer position 24. Similarly, if an article transport vehicle 10 is stopped ahead at another second transfer position 24 on the upstream side of the second transfer position 24 that is the destination, and the trailing article transport vehicle 10 cannot reach the destination second transfer position 24, the second control device 92 causes the trailing article transport vehicle 10 to stop (wait) at a position in front of the upstream second transfer position 24. In the example shown in FIG. 7, an article transport vehicle 10 (here, a loaded transport vehicle 10a) is stopped ahead at the second transfer position 24 located on the most upstream side in the first section 43. For this reason, the trailing article transport vehicle 10 (here, an empty transport vehicle 10b) stops (waits) in the connecting section 46 upstream of the first section 43. By controlling the article transport vehicles 10 in this way, the second control device 92 avoids a collision between one article transport vehicle 10 and an article transport vehicle 10 ahead thereof while causing article transport vehicles to transport articles W. In this way, in a configuration in which the processing devices are directly connected to the second route 42, given that the second route 42 is a one-way path, when one article transport vehicle 10 stops ahead, the trailing article transport vehicle 10 also needs to stop. Accordingly, the smooth traveling of the article transport vehicles 10 on the second route 42 is directly or indirectly hindered, and the efficiency of article W transport tends to decrease. On the other hand, if the number of article transport vehicles 10 traveling on the main transport route 4 is increased in order to increase the efficiency of article W transport, the number of the article transport vehicles 10 that will stop on the second route 42 also increases. Accordingly, congestion is likely to occur on the second route 42 in particular, and the efficiency of article W transport actually decreases.

In view of the foregoing, in the article transport facility 1 according to the present embodiment, as shown in FIGS. 3 to 6, branch routes (first branch route 5 and second branch route 6) are provided in the second route 42, and processing devices (here, first processing devices 81) are connected to the second route 42 via the branch routes. Accordingly, the article transport vehicles 10 can move articles W to and from ports (here, first ports 81a) without stopping on the second route 42. The first transport control for controlling the article transport vehicles 10 traveling on the branch routes will be described in detail below.

Figure 4:
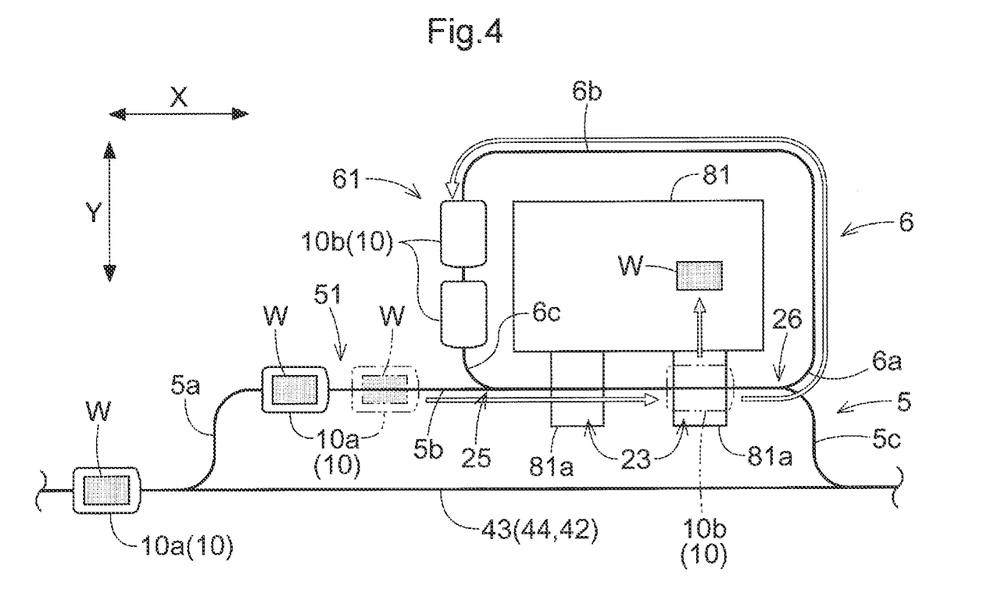
FIG. 4 is a plan view schematically showing a travel route of loaded transport vehicles.

As shown in FIG. 4, in the present embodiment, when a command to transport an article W to the first port 81a of a first processing device 81 is received from the first control device 91, the second control device 92 causes a loaded transport vehicle 10a stopped (waiting) in the first standby section 51 to travel toward the first port 81a. The loaded transport vehicle 10a passes through the merge portion 25, stops at the first transfer position 23 that corresponds to the first port 81a that is the transport destination, and delivers the article W to the first port 81a. The second control device 92 then causes that article transport vehicle 10, which has changed from being a loaded transport vehicle 10a to being an empty transport vehicle 10b due to delivering the article W to the first port 81a, to move to the second standby section 61. Specifically, the empty transport vehicle 10b travels along the first main line portion 5b from the first transfer position 23, and moves to the second branch connection portion 6a of the second branch route 6. The empty transport vehicle 10b then travels along the second main line portion 6b and stops in the second standby section 61. In the illustrated example, the empty transport vehicle 10b moves from the downstream end region of the first main line portion 5b to the second branch connection portion 6a, travels along the second main line portion 6b, and stops (waits) in the second standby section 61 set in front of the second merge connection portion 6c.

Figure 5:
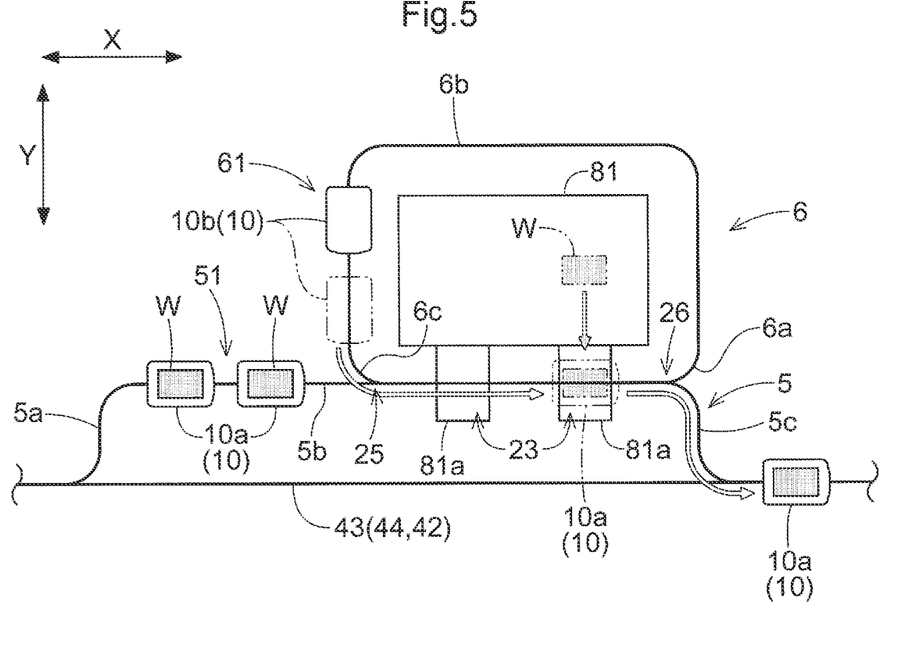
FIG. 5 is a plan view schematically showing a travel route of an empty transport vehicle.

As shown in FIG. 5, in the present embodiment, when a command to receive an article W from the first port 81a of a first processing device 81 is received from the first control device 91, the second control device 92 causes an empty transport vehicle 10b that is stopped (waiting) in the second standby section 61 to travel toward the first port 81a. The empty transport vehicle 10b passes through the merge portion 25, moves to the first main line portion 5b, stops at the first transfer position 23 that corresponds to the first port 81a where the article W is to be received, and receives the article W from the first port 81a. That article transport vehicle 10, which has received the article W and changed from being an empty transport vehicle 10b to being a loaded transport vehicle 10a, then moves from the first merge connection portion 5c to the main transport route 4 (here, the second route 42) based on a new transport command.

In the present embodiment, as shown in FIG. 4, if the first port 81a is ready to receive the article W, the second control device 92 allows a loaded transport vehicle 10a to pass through the merge portion 25 between the first branch route 5 and the second branch route 6 with priority. Also, as shown in FIG. 5, if an article W processed by a first processing device 81 is to be unloaded from a first port 81a, an empty transport vehicle 10b is allowed to pass through the merge portion 25 with priority. In this way, at the merge portion 25, it is possible to avoid competition between a loaded transport vehicle 10a waiting in the first standby section 51 and an empty transport vehicle 10b waiting in the second standby section 61. In this example, based on information regarding the first ports 81a received from the first control device 91 (here, information indicating whether the first port 81a can receive an article W or can unload an article W that was processed), the second control device 92 assigns destination first transfer positions 23, in order from the downstream side, to article transport vehicles 10 that are waiting in the first standby section 51 and the second standby section 61. The second control device 92 then successively causes the article transport vehicles 10 to move to the corresponding destination first transfer positions 23, in order from the article transport vehicle 10 assigned to the most downstream first transfer position 23. In the example shown in FIG. 4, the first transfer position 23 on the most downstream side is assigned to the loaded transport vehicle 10a that is waiting closest to the merge portion 25 in the first standby section 51. In this case, the second control device 92 allows that loaded transport vehicle 10a to travel with priority over the empty transport vehicle 10b in the second standby section 61, and causes the loaded transport vehicle 10a to travel toward the destination first transfer position 23. In the example shown in FIG. 5, the first transfer position 23 on the most downstream side is assigned to the empty transport vehicle 10b that is waiting closest to the merge portion 25 in the second standby section 61. In this case, the second control device 92 allows that empty transport vehicle 10b to travel with priority over the loaded transport vehicle 10a in the first standby section 51, and causes the empty transport vehicle 10b to travel toward the first transfer position 23 where the article is to be received.

Also, in the present embodiment, the second control device 92 executes control to dispatch an article transport vehicle 10 traveling on the main transport route 4 (a loaded transport vehicle 10a or an empty transport vehicle 10b) to a standby section (a first standby section 51 or a second standby section 61). In this example, the second control device 92 performs control for causing an article transport vehicle 10 that is traveling on the main transport route 4 to move to a standby section (a first standby section 51 or a second standby section 61), based on the processing completion time of a first processing device 81. Specifically, the first processing device 81 predicts a processing completion time, which is the time at which an article W processed by a first processing device 81 can be unloaded from a first port 81a, and transmits information regarding the processing completion time to the first control device 91. Upon receiving the information regarding the processing completion time of the first processing device 81 from the first control device 91, the second control device 92 controls the article transport vehicles 10 traveling on the main transport route 4 such that a loaded transport vehicle 10a and an empty transport vehicle 10b on the main transport route 4 respectively reach the first standby section 51 and the second standby section 61 at a time that is a predetermined time before the processing completion time. For example, the second control device 92 causes the empty transport vehicle 10b that is closest to the merge portion 25 in the second standby section 61 to move to the first transfer position 23 corresponding to the first port 81a from which the article W is to be received, at a time that is the predetermined time before the processing completion time. In the case where a different article transport vehicle 10 is stopped at a first transfer position 23 located before (upstream of) the first transfer position 23 corresponding to the first port 81*a* from which the article W is to be received, it is preferable to start the movement of the other article transport vehicle 10 before causing the empty transport vehicle 10*b* to move. In this way, it is preferable that the second control device 92 can control both the loaded transport vehicles 10*a* and the empty transport vehicles 10*b* in accordance with the statuses of the first processing devices 81.

Figure 6:
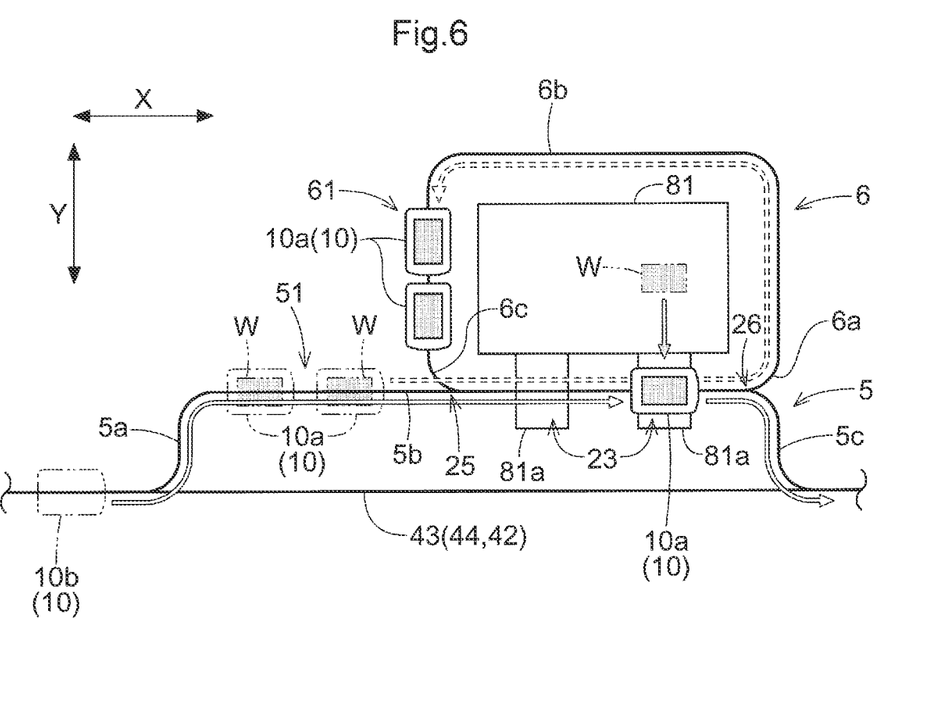
FIG. 6 is a plan view schematically showing travel routes of an empty transport vehicle and loaded transport vehicles.

In the present embodiment, as described above, in the case where an article W processed by a first processing device 81 is to be unloaded from a first port 81*a*, and furthermore an empty transport vehicle 10*b* is waiting in a second standby section 61, the second control device 92 causes the empty transport vehicle 10*b* waiting in the second standby section 61 to travel toward the corresponding first transfer position 23. On the other hand, as shown in FIG. 6, in the case where an empty transport vehicle 10*b* is not waiting in the second standby section 61, the second control device 92 causes an empty transport vehicle 10*b* located outside the second standby section 61 to travel toward the first transfer position 23. In this example, in the case where no empty transport vehicle 10*b* is waiting in the second standby section 61, the second control device 92 selects the empty transport vehicle 10*b* that will arrive at the second standby section 61 in the shortest time from among the empty transport vehicles 10*b* located on the main transport route 4 (the first route 41 or the second routes 42), and causes the selected empty transport vehicle 10*b* to travel to the second standby section 61. In this case, the second control device 92 moves all of the loaded transport vehicles 10*a* that are waiting in the first standby section 51, and causes the selected empty transport vehicle 10*b* to travel toward the target first port 81*a*. Accordingly, the empty transport vehicle 10*b* can move from the second route 42 to the first branch route 5 and reach the first port 81*a*. In this example, the second control device 92 causes all of the loaded transport vehicles 10*a* waiting in the first standby section 51 to travel to the second standby section 61. The one or more loaded transport vehicles 10*a* travel from the first standby section 51 to the branch portion 26, and then travel from the second branch route 6 to the second standby section 61. In this case, if the first port 81*a* is ready to receive the article W, the second control device 92 allows the loaded transport vehicle 10*a* in the second standby section 61 to pass through the merge portion 25 with priority.

Second Embodiment

A second embodiment of the article transport facility will be described below with reference to FIG. 9. The following description of the article transport facility 1 according to the present embodiment focuses on differences from the first embodiment. Aspects that are not particularly mentioned are similar to those in the first embodiment, are denoted by the same reference numerals, and will not be described in detail.

Figure 9:
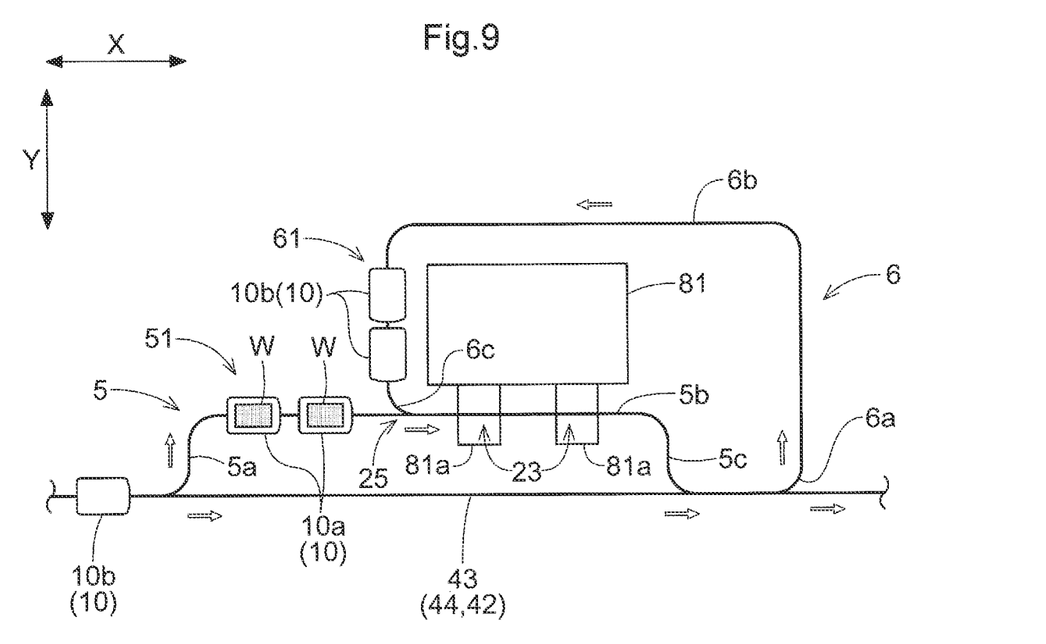
FIG. 9 is a plan view schematically showing the arrangement of a first branch route and a second branch route according to a second embodiment.

As shown in FIG. 9, the second branch route 6 branches off from the main transport route 4 and merges with the first branch route 5 at a position upstream of the first transfer positions 23. In the present embodiment, the second branch route 6 branches off from the main transport route 4 at a position downstream of the first branch route 5. In other words, the second branch route 6 branches off from the main transport route 4 at a position downstream of the first transfer positions 23. In this example, the second branch route 6 branches off from the second route 42 at a position downstream of the merge point between the first merge connection portion 5*c* and the second route 42. The second branch connection portion 6*a* is a section that branches off from the second route 42 at a position downstream of the merge point, and is a section in which an article transport vehicle 10 that has delivered an article W to a first port 81*a* (i.e., an empty transport vehicle 10*b*) or an empty transport vehicle 10*b* that has not passed through the first branch route 5 moves (diverges) from the second route 42 to the second branch route 6. The empty transport vehicle 10*b* that moved to the second branch connection portion 6*a* then travels along the second main line portion 6*b*, moves to the second standby section 61, and stops (waits) there.

In this example, in the case where no empty transport vehicle 10*b* is waiting in the second standby section 61, the second control device 92 selects the empty transport vehicle 10*b* that will arrive at the second standby section 61 in the shortest time from among the empty transport vehicles 10*b* located on the main transport route 4 (first route 41 or second route 42), and causes the selected empty transport vehicle 10*b* to travel to the second standby section 61. In this case, the empty transport vehicle 10*b* diverges from the second route 42 to the second branch route 6 without passing through the first branch route 5, and moves to the second standby section 61. Accordingly, in the second embodiment, a loaded transport vehicle 10*a* stopped (waiting) in the first standby section 51 does not travel on the second branch route 6.

Third Embodiment

A third embodiment of the article transport facility will be described below with reference to FIGS. 10 and 11. The following description of the article transport facility 1 according to the present embodiment focuses on differences from the first embodiment and the second embodiment. Aspects that are not particularly mentioned are similar to those in the first and second embodiments, are denoted by the same reference numerals, and will not be described in detail.

Figure 10:
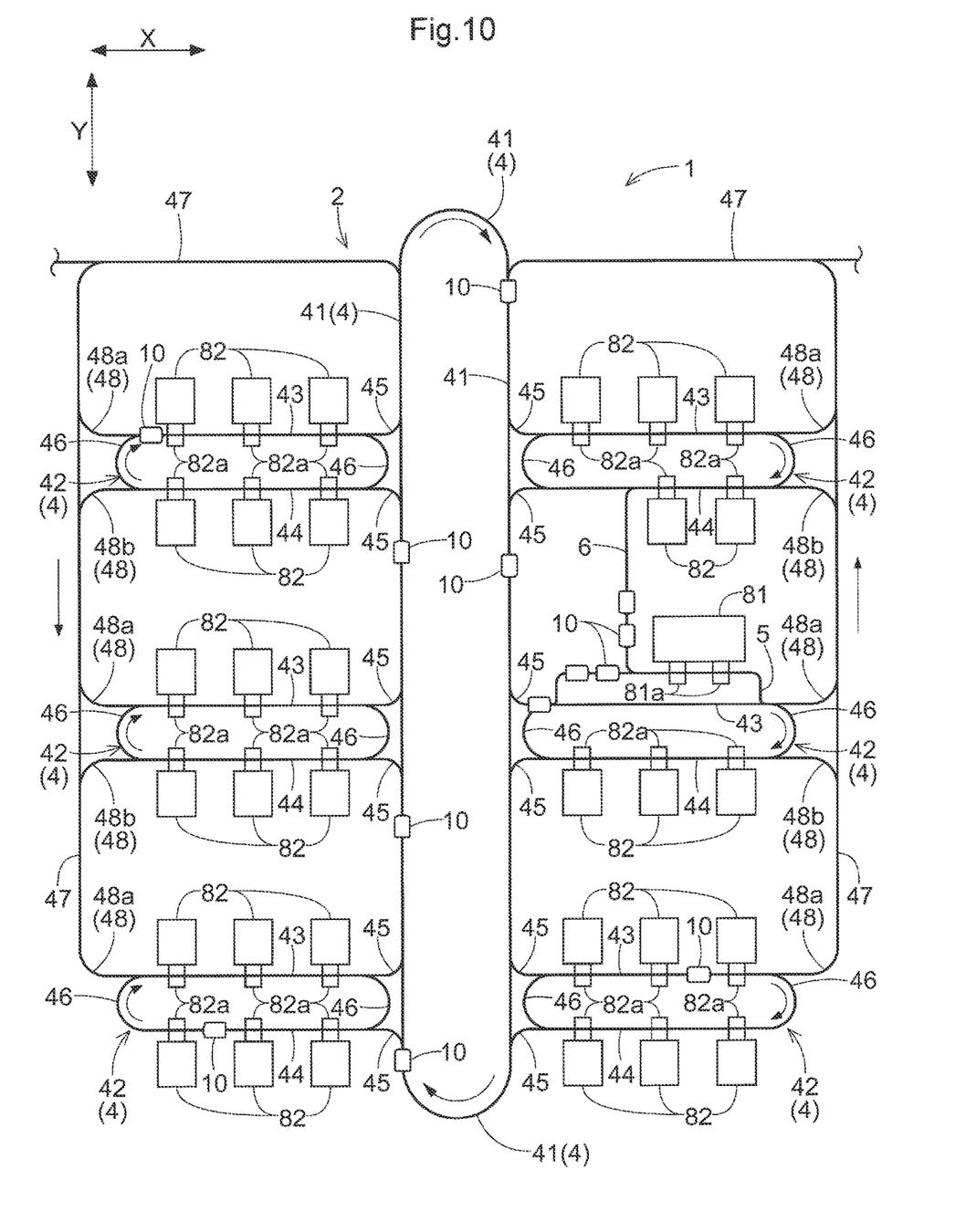
FIG. 10 is a plan view of an article transport facility according to a third embodiment.
Figure 11:
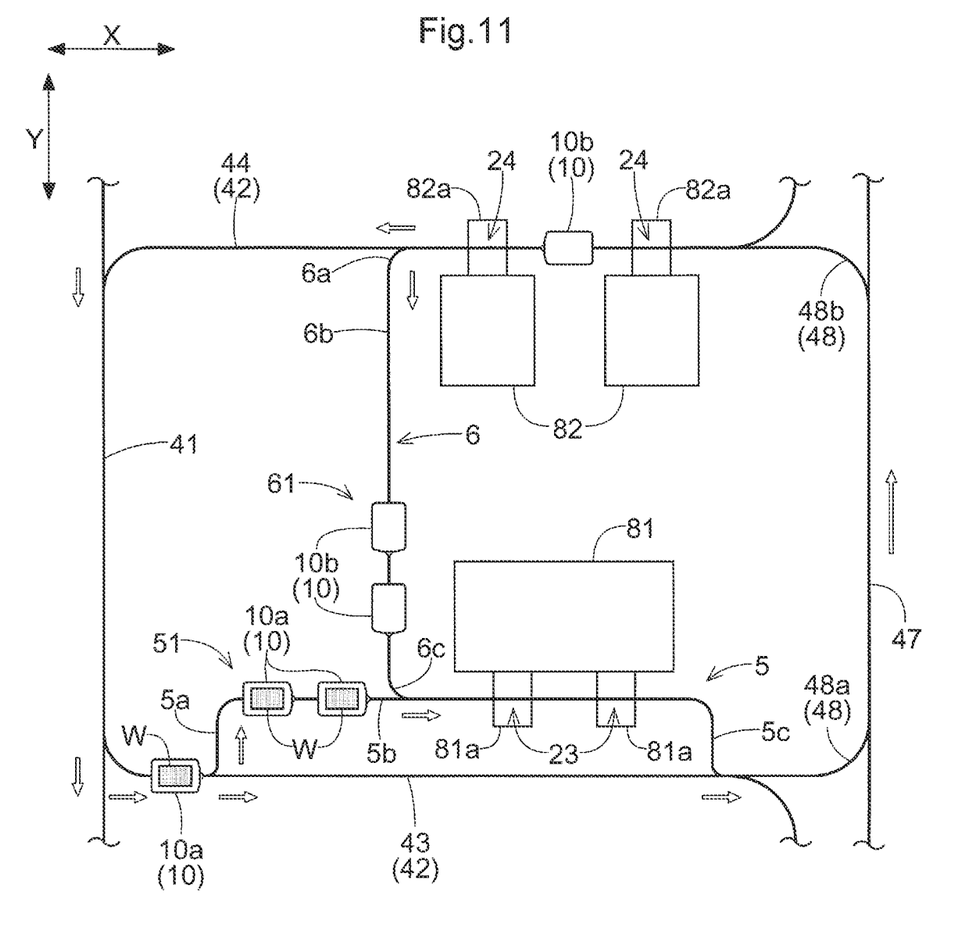
FIG. 11 is a plan view schematically showing the arrangement of a first branch route and a second branch route according to the third embodiment.

As shown in FIGS. 10 and 11, the second branch route 6 branches off from the main transport route 4 and merges with the first branch route 5 at a position upstream of the first transfer positions 23. In the present embodiment, as shown in FIG. 11, the second branch route 6 branches off from a second route 42 that is different from the second route 42 to which the corresponding first branch route 5 is connected, and merges with the first branch route 5 at a position upstream of the first transfer positions 23. In this example, the second branch route 6 branches off from the second route 42 (here, the second section 44) adjacent to the second route 42 to which the corresponding first branch route 5 is connected. In the illustrated example, the second branch route 6 branches off from the second route 42 adjacent in the second direction Y to the second route 42 to which the first branch route 5 is connected. Also, in this example, the second branch connection portion 6*a* is a section that branches off from the second section 44 of the adjacent second route 42 as described above, and is a section in which an empty transport vehicle 10*b* traveling on the adjacent second route 42 moves (diverges) to the second branch route 6. The empty transport vehicle 10*b* that moved to the second branch connection portion 6*a* then travels along the second main line portion 6*b*, moves to the second standby section 61, and stops (waits) there. In the illustrated example, on the adjacent second route 42, an article transport vehicle can deliver an article W to the second port 82*a* of a second processing device 82 so as to change from being a loaded transport vehicle 10*a* to being an empty transport vehicle 10*b*, and can then quickly move to the second branch connection portion 6*a*, and move to the second standby section 61 by traveling on the second main line portion 6*b* that extends in the second direction Y. In other words, the point for branching from the second section 44 to the second branch connection portion 6*a* is adjacent to the most downstream second transfer position 24 among the plurality of (here, two) second transfer positions 24. Note that in the example shown in FIG. 11, second processing devices 82 are provided on the adjacent second route 42, but a first processing device 81 may be provided.

In the present embodiment, as shown in FIGS. 10 and 11, the main transport route 4 further includes third routes 47. The third routes 47 connect the first route 41 to the second routes 42. In this example, as shown in FIG. 10, the third routes 47 connect the first route 41 to the second routes 42, and also connect second routes 42 to each other. The third routes 47 are directly connected to the first route 41, and are indirectly connected to the second routes 42 via connecting routes 48. In the example shown in FIG. 10, the third routes 47 are arranged so as to surround the first branch routes 5, the second branch routes 6, and the second routes 42. Also, the third routes 47 are divided in the first direction X into a plurality of (here, two) routes that correspond to the groups of second routes 42 arranged on the two sides of the first route 41 in the first direction X. The third routes 47 are each connected to the end regions of the first route 41 in the second direction Y.

In this example, the connecting routes 48 connect the second routes 42 to the third routes 47, as shown in FIGS. 10 and 11. The connecting routes 48 include first connecting routes 48*a* and second connecting routes 48*b*. Each of the first connecting routes 48*a* branches off from a position downstream of the transfer positions (first transfer positions 23 or second transfer positions 24) in the corresponding first section 43, and merge with the corresponding third route 47. Each of the second connecting routes 48*b* is arranged so as to branch off from the corresponding third route 47 and merge with the corresponding second section 44 at a position upstream of the transfer positions (second transfer positions 24).

In the situation shown in FIGS. 10 and 11, an empty transport vehicle 10*b* waiting in the second standby section 61 passes through the merge portion 25, stops at a first transfer position 23, and receives an article W from the corresponding first port 81*a* in accordance with a command from the second control device 92. That article transport vehicle 10, which received the article W and changed from being an empty transport vehicle 10*b* to being a loaded transport vehicle 10*a*, then moves to the transfer position (first transfer position 23 or second transfer position 24) that corresponds to the port (first port 81*a* or second port 82*a*) to which the article W is to be transported. For example, the loaded transport vehicle 10*a* may travel along the third route 47, move to the transfer position (here, the second transfer position 24) in the second section 44 of the adjacent second route 42 with respect to the second direction Y, and deliver the article W to the corresponding port (here, the second port 82*a*) (see FIG. 11). Thereafter, that article transport vehicle 10, which has delivered the articles W and changed from being a loaded transport vehicle 10*a* to an empty transport vehicle 10*b*, then moves to the second standby section 61 and stops (waits) as described above. Also, a loaded transport vehicle 10*a* waiting in the first standby section 51 may stop at a first transfer position 23 and deliver an article W to the first port 81*a*, thus changing to being an empty transport vehicle 10*b*, or may stop at a transfer position (here, a second transfer position 24) in the adjacent second section 44 and deliver the article W to the corresponding port (here, a second port 82*a*), thus changing to being an empty transport vehicle 10*b*. The article transport vehicle 10, which delivered the article W to the first port 81*a* and changed from being a loaded transport vehicle 10*a* to being an empty transport vehicle 10*b* as described above, then travels on the third route 47 (here, the third route adjacent 47 located between the second routes 42 adjacent to each other in the second direction Y), and moves to the second standby section 61.

In this way, in the present embodiment, even in the case of a configuration in which the main transport route 4 further includes the third routes 47 and thus the second branch route 6 branches off from a second route 42 that is different from the second route 42 to which the corresponding first branch route 5 is connected, the second control device 92 can cause an empty transport vehicle 10*b* to quickly move to the second standby section 61.

Note that in the examples shown in FIGS. 10 and 11, processing devices (first processing devices 81, second processing devices 82) are not provided along the third routes 47. However, a configuration is possible in which one or more transfer positions (first transfer positions 23 or second transfer positions 24) are arranged on the third routes 47, and a processing device is provided in correspondence with each of the one or more transfer positions.

Other Embodiments

Other embodiments of the article transport facility will be described below.

(1) In the first embodiment, an example is described in which some of the second routes 42 include first processing devices 81 and corresponding branch routes (first branch routes 5 and second branch routes 6, but the present invention is not limited to this. For example, all of the second routes 42 may be provided with first processing devices 81 and corresponding branch routes. Also, branch routes may be arranged in correspondence with second processing devices 82. Moreover, a configuration is possible in which one set of branch routes (first branch route 5, second branch route 6) is arranged for each set of adjacent processing devices (first processing devices 81, second processing devices 82). In this way, it is preferable that the arrangement of processing devices and branch routes can be changed as appropriate in the article transport facility 1.

(2) In the above embodiments, an example is described in which the merge portion 25 between the first branch route 5 and the second branch route 6 is arranged adjacent to the first transfer positions 23 on the upstream side thereof. However, the present invention is not limited to such a configuration, and the merge portion 25 is not required to be arranged adjacent to the first transfer positions 23 on the upstream side thereof. For example, the merge portion 25 may be arranged in the end region on the upstream side of the first branch route 5 of the first main line portion 5*b*. In this case, the first standby section 51 may be set in the first branch connection portion 5*a*.

(3) In the above embodiments, an example is described in which the first standby section 51 and the second standby section 61 each have a length that allows a plurality of article transport vehicles 10 to wait therein, but the present invention is not limited to this. For example, the first standby section 51 and the second standby section 61 may each have a length that allows only one article transport vehicle 10 to wait therein. Also, a configuration is possible in which the first standby section 51 and the second standby section 61 have different lengths such that the number of article transport vehicles 10 that can wait in the first standby section 51 is different from the number of article transport vehicles 10 that can wait in the second standby section 61. Also, a configuration is possible in which the first standby section 51 and the second standby section 61 include a plurality of vehicle lanes such that a plurality of article transport vehicles 10 can wait in parallel.

(4) In the above embodiments, an example is described in which each of the first processing devices 81 includes N (N being an integer greater than or equal to 2) first ports 81*a*, and thus the first branch route 5 passes through N first transfer positions 23. However, the present invention is not limited to this configuration, the N first transfer positions 23 through which the first branch route 5 passes may include a first transfer position 23 for the transfer of an article W to a first port 81*a* of a first processing device 81, and a first transfer position 23 for the transfer of an article W to a first port 81*a* of a different first processing device 81. Also, each of the first processing devices 81 may have a single first port 81*a*, and in this case, the first branch routes 5 passes through a single first transfer position 23, for example. Also, it is not required that all of the first processing devices 81 have the same number of first ports 81*a*, and the number of first ports 81*a* may be set independently for each first processing device 81 as necessary.

(5) In the above embodiments, an example is described in which the second control device 92 performs control such that all of the article transport vehicles 10 that have changed from being a loaded transport vehicle 10*a* to being an empty transport vehicle 10*b* due to delivering an article W to a first port 81*a* are moved to a second standby section 61, but the present invention is not limited to this. For example, some article transport vehicles 10 that have delivered an article W to a first port 81*a* and changed to being an empty transport vehicles 10*b* may merge with the main transport route 4 and travel thereon, instead of traveling to a second standby section 61.

(6) In the above embodiments, an example is described in which when an article W processed by a first processing device 81 is to be unloaded from a first port 81*a*, an empty transport vehicle 10*b* is allowed to pass through the merge portion 25 with priority. However, the present invention is not limited to this configuration, and a configuration is possible in which when an article W processed by a first processing device 81 is to be unloaded from the first port 81*a*, the passage of an empty transport vehicle 10*b* through the merge portion 25 is not prioritized. For example, a configuration is possible in which when the number of loaded transport vehicles 10*a* waiting in the first standby section 51 is larger than the number of empty transport vehicles 10*b* waiting in the second standby section 61, a loaded transport vehicle 10*a* is first allowed to pass through the merge portion 25 with priority and merge with the second route 42.

(7) In the above embodiments, an example is described in which when no empty transport vehicle 10*b* is waiting in the second standby section 61, the second control device 92 causes an empty transport vehicle 10*b* located outside the second standby section 61 to travel to the first transfer position 23. However, the present invention is not limited to this configuration, and a configuration is possible in which, in the case where no empty transport vehicle 10*b* is waiting in the second standby section 61, the second control device 92 waits for an empty transport vehicle 10*b* that has moved from the first standby section 51 to a first port 81*a* and delivered an article W to arrive at the second standby section 61, and then causes that empty transport vehicle 10*b* to travel to the first transfer position 23.

(8) In the second embodiment, an example is described in which the second branch route 6 branches off from the second route 42 on the downstream side of the first branch route 5, but the present invention is not limited to this. For example, the second branch route 6 can branch off from the connection route 45 on the downstream side of the first branch route 5 or from the first route 41 on the downstream side of the first branch route 5.

(9) In the third embodiment, an example is described in which the second branch route 6 branches off from the second route 42 that is adjacent to the second route 42 to which the first branch route 5 is connected. However, the present invention is not limited to this configuration, and the second branch route 6 may branch off from any second route 42 among the second routes 42 to which the first branch route 5 is not connected.

(10) It should be noted that the configurations disclosed in each of the above-described embodiments can also be applied in combination with configurations disclosed in other embodiments (including combinations between embodiments described as other embodiments) as long as no contradiction arises. Regarding such other configurations as well, the embodiments disclosed in this specification are merely examples in all respects. Therefore, various modifications can be made as appropriate without departing from the scope of the present disclosure.

Overview of Embodiments

The following describes an overview of the unloading device described above.

An article transport facility according to an aspect of the present disclosure is an article transport facility including a plurality of article transport vehicles each configured to travel along a predetermined travel route and transport an article, the travel route including:
a main transport route connecting a plurality of processing devices to each other;
a first branch route branching from the main transport route, passing through a transfer position at which an article is transferred to a port of a first processing device among the plurality of processing devices, and merging with the main transport route; and
a second branch route branching from the first branch route at a position downstream of the transfer position, or branching from the main transport route, and merging with the first branch route at a position upstream of the transfer position, the first branch route including, at a position upstream of the transfer position, a first standby section enabling a loaded transport vehicle, which is an article transport vehicle holding an article among the plurality of article transport vehicles, to wait therein, and the second branch route including a second standby section enabling an empty transport vehicle, which is an article transport vehicle not holding an article among the plurality of article transport vehicles, to wait therein.

According to this configuration, both the loaded transport vehicle and the empty transport vehicle can be caused to wait in a standby state on the upstream side of the transfer position without hindering the traveling of other article transport vehicles on the main transport route. Accordingly, when a processed article has appeared at the port of a processing device, the empty transport vehicle can be quickly dispatched to the port. Also, after the article has been unloaded from the port of the processing device, the loaded transport vehicle can be quickly dispatched to the port and supply a new article to the port. Accordingly, articles can be efficiently delivered to and unloaded from the processing device.

Here, in the case where the second branch route branches off from the first branch route, the empty transport vehicle that has transferred an article to the port can quickly travel to the second standby section without hindering the traveling of article transport vehicles on the main transport route.

Also, in the case where the second branch route branches off from the main transport route, even if a loaded transport vehicle is stopped at the transfer position, for example, an empty transport vehicle traveling on the main transport route can quickly move to the second standby section.

In this way, according to the present disclosure, it is possible to avoid the case where the passage of an article transport vehicle on the main transport route is hindered by an article transport vehicle waiting in front of a port, and articles can be efficiently transported to processing devices.

Here, it is preferable that the travel route further includes a merge portion between the first branch route and the second branch route, the merge portion being disposed adjacent to the transfer position on an upstream side thereof.

According to this configuration, the empty transport vehicle waiting in the second standby section can easily reach the transfer position quickly. Accordingly, when a processed article has appeared at the port of a processing device, the processed article can be quickly unloaded.

Also, it is preferable that the first standby section and the second standby section each have a length enabling a plurality of the article transport vehicles to wait therein.

According to this configuration, a plurality of loaded transport vehicles and a plurality of empty transport vehicles can be caused to wait in a standby state on the upstream side of the transfer position. Accordingly, a loaded transport vehicle or an empty transport vehicle can be quickly dispatched to the transfer position. Accordingly, articles can be delivered to and unloaded from processing devices more efficiently.

Also, it is preferable that the first branch route passes through N (N being an integer greater than or equal to 2) transfer positions, the first standby section has a length enabling N loaded transport vehicles to wait therein, and the second standby section has a length enabling N empty transport vehicles to wait therein.

According to this configuration, in the case where the first branch route passes through a plurality of transfer positions, the same number of loaded transport vehicles and/or empty transport vehicles as the number of transfer positions can be caused to wait in a standby state on the upstream side of the transfer positions. Accordingly, a loaded transport vehicle or an empty transport vehicle can be quickly dispatched to each of the transfer positions. Accordingly, articles can be delivered to and unloaded from processing devices more efficiently.

Also, it is preferable that the article transport facility further includes: a control device configured to control the article transport vehicles, wherein the control device causes an article transport vehicle that changed from being the loaded transport vehicle to being the empty transport vehicle due to transferring an article to the port to move to the second standby section.

According to this configuration, an article transport vehicle that has changed from being a loaded transport vehicle to being an empty transport vehicle can travel directly from the transfer position, where the article was transferred, to the second standby section of the second branch route. Accordingly, the traveling distance of the empty transport vehicle can be kept short, and the overall energy efficiency of the article transport facility can be easily improved.

Also, it is preferable that the article transport facility further includes:
  a control device configured to control the article transport vehicles,
  wherein in response to the port being able to receive an article, the control device causes the loaded transport vehicle to pass through a merge portion between the first branch route and the second branch route with priority, and
  in response to a need to unload an article processed by the first processing device from the port, the control device causes the empty transport vehicle to pass through the merge portion with priority.

According to this configuration, either a loaded transport vehicle or an empty transport vehicle can be selected in accordance with the state of the port and caused to travel to the transfer position with priority. Accordingly, an article can be quickly delivered to or unloaded from the port.

Also, it is preferable that in response to (i) the need to unload the article processed by the first processing device from the port, and (ii) the empty transport vehicle waiting in the second standby section, the control device causes the empty transport vehicle waiting in the second standby section to travel to the transfer position, and in response to (i) the need to unload the article processed by the first processing device from the port, and (ii) the empty transport vehicle not waiting in the second standby section, the control device causes an empty transport vehicle located outside the second standby section to travel to the transfer position.

According to this configuration, depending on whether or not an empty transport vehicle is waiting in the second standby section, an empty transport vehicle can be appropriately selected and caused to travel to the transfer position.

The article transport facility according to the present disclosure need only achieve at least one of the effects described above.

What is claimed is:

1. An article transport facility comprising a plurality of article transport vehicles each configured to travel along a predetermined travel route and transport an article,
  the travel route comprising:

a main transport route connecting a plurality of processing devices to each other;

a first branch route branching from the main transport route, passing through a transfer position at which an article is transferred to a port of a first processing device among the plurality of processing devices, and merging with the main transport route; and a second branch route branching from the first branch route at a position downstream of the transfer position, or branching from the main transport route, and merging with the first branch route at a position upstream of the transfer position, the first branch route including, at a position upstream of the transfer position, a first standby section enabling a loaded transport vehicle, which is an article transport vehicle holding an article among the plurality of article transport vehicles, to wait therein, and the second branch route including a second standby section enabling an empty transport vehicle, which is an article transport vehicle not holding an article among the plurality of article transport vehicles, to wait therein.

2. The article transport facility according to claim 1, wherein the travel route further comprises a merge portion between the first branch route and the second branch route, the merge portion disposed adjacent to the transfer position on an upstream side thereof.

3. The article transport facility according to claim 1, wherein the first standby section and the second standby section each have a length enabling a plurality of the article transport vehicles to wait therein.

4. The article transport facility according to claim 3, wherein:

the first branch route passes through N (N being an integer greater than or equal to 2) transfer positions, the first standby section has a length enabling N loaded transport vehicles to wait therein, and the second standby section has a length enabling N empty transport vehicles to wait therein.

5. The article transport facility according to claim 1, further comprising:

a control device configured to control the article transport vehicles, and wherein the control device causes an article transport vehicle that changed from being the loaded transport vehicle to being the empty transport vehicle due to transferring an article to the port to move to the second standby section.

6. The article transport facility according to claim 1, further comprising:

a control device configured to control the article transport vehicles, wherein in response to the port able to receive an article, the control device causes the loaded transport vehicle to pass through a merge portion between the first branch route and the second branch route with priority, and wherein in response to a need to unload an article processed by the first processing device from the port, the control device causes the empty transport vehicle to pass through the merge portion with priority.

7. The article transport facility according to claim 6, wherein in response to (i) the need to unload the article processed by the first processing device from the port, and (ii) the empty transport vehicle waiting in the second standby section, the control device causes the empty transport vehicle waiting in the second standby section to travel to the transfer position, and wherein in response to (i) the need to unload the article processed by the first processing device from the port, and (ii) the empty transport vehicle not waiting in the second standby section, the control device causes an empty transport vehicle located outside the second standby section to travel to the transfer position.

* * * * *